United States Patent [19]

Srinivasan et al.

[11] Patent Number: 5,664,568

[45] Date of Patent: Sep. 9, 1997

[54] SPLIT-TOP, NECK AND HEAD VASCULAR ARRAY FOR MAGNETIC RESONANCE IMAGING

[75] Inventors: Ravi Srinivasan, Richmond Hts.; Robert G. Henderson, Wickliffe; Robert A. Elek, Chardon, all of Ohio

[73] Assignee: Picker International, Inc., Highland Heights, Ohio

[21] Appl. No.: 512,722

[22] Filed: Aug. 8, 1995

[51] Int. Cl.$^6$ .................................................. A61B 5/055
[52] U.S. Cl. ............................ 128/653.2; 128/653.5; 324/318; 324/322
[58] Field of Search ........................... 324/318, 322; 128/653.1, 653.2, 653.3, 653.4

[56] References Cited

U.S. PATENT DOCUMENTS

| | | | |
|---|---|---|---|
| 4,692,705 | 9/1987 | Hayes | 324/318 |
| 4,769,605 | 9/1988 | Fox | 324/322 |
| 4,783,641 | 11/1988 | Hayes et al. | 333/219 |
| 4,825,162 | 4/1989 | Roemer et al. | 324/318 |
| 4,837,515 | 6/1989 | Nishihara et al. | 324/318 |
| 5,166,618 | 11/1992 | Jones et al. | 324/318 |
| 5,221,902 | 6/1993 | Jones et al. | 324/318 |
| 5,302,901 | 4/1994 | Snelten | 324/322 |
| 5,347,220 | 9/1994 | Van Heelsbergen | 324/318 |
| 5,370,118 | 12/1994 | Vij et al. | 128/653.5 |
| 5,394,087 | 2/1995 | Molyneaux | 324/318 |
| 5,543,711 | 8/1996 | Srinivasan et al. | 324/318 |
| 5,551,430 | 9/1996 | Blakeley et al. | 128/653.2 |

OTHER PUBLICATIONS

"The NMR Phased Array", Roemer, et al., Academic Press, Inc. 1990 Magnetic Resonance in Medicine 16, 192–225 (1990).

"Optimized Birdcage Resonators for Simultaneous MRI of Head and Neck", Leussler, SMRM 1993, p. 1349.

"An Efficient, Highly Homogenous Radiofrequency Coil for Whole–Body NMR Imaging at 1.5 T", Hayes, et al., pp. 622–628.

"Head and Neck Vascular Array Coil For MRI", Srinivasan, et al., Society of Magnetic Resonance, 2nd Annual Meeting, San Francisco, CA (1994) p. 1107.

"Novel Two Channel Volume Array Design for Antiography of the Head and Neck", Reykowski, et al., SMR 2nd Annual Meeting, San Fransisco, CA (1994) p. 216.

"The Asymmetric Birdcage Design: A Quadrature Neck Coil Application", Vij, et al., SMRM 11th Annual Meeting, Berlin, Germany (1992) p. 4010.

(List continued on next page.)

*Primary Examiner*—Marvin M. Lateef
*Assistant Examiner*—Derrick Fields
*Attorney, Agent, or Firm*—Fay, Sharpe, Beall, Fagan, Minnich & McKee

[57] ABSTRACT

A coil assembly (40) includes a first, birdcage type head coil assembly (42) dimensioned to receive a patient's head and a second, neck coil assembly (44) including an anterior coil portion (44a) and a posterior coil portion (44b) dimensioned to receive the patient's neck region. The head and neck coils are partially overlapped. A first cable extends (98a) from the anterior coil portion past the birdcage head coil assembly and a second coaxial cable (98b) extends from the posterior portion past the birdcage head coil assembly. A first decoupling circuit (104a) is disposed in the first coaxial cable beyond a guard ring (106) and a second decoupling circuit (104b) is disposed in the second coaxial cable adjacent the region of overlap between the head and neck coil assemblies. The decoupling circuits are positioned and tuned to prevent radio frequency communication along the coaxial cable sheath between the head and neck coil assemblies. The head and neck coil assemblies are mounted in the mechanical housing which is openable such that an upper half of the guard ring and the birdcage coil and the anterior coil are removable as a unit from the lower half of the guard ring and birdcage coil and the posterior neck coil to facilitate patient access.

24 Claims, 8 Drawing Sheets

OTHER PUBLICATIONS

"Three Dimensional Electromagnetic Field Calculation of MR-Antennas", Dürr SMRM 7th Annual Meeting, San Francisco, CA (1988) p. 844.

"Quadrature-Headcoil and Helmholtz-Type Neckcoil—An Optimized RF Antenna-Pair For Imaging Head, Neck, and C-Spine at 1.0 and 1.5 T", Krause, et al. SMRM 7th Annual Meeting, San Francisco, CA (1988) p. 845.

"Application of High-Order Coils to Surface Coil Imaging of the Lumbar Spine at 1.5 Tesla", Foo, et al., 5th Annual Meeting SMR, Montreal Quebec (1986) pp. 53–54.

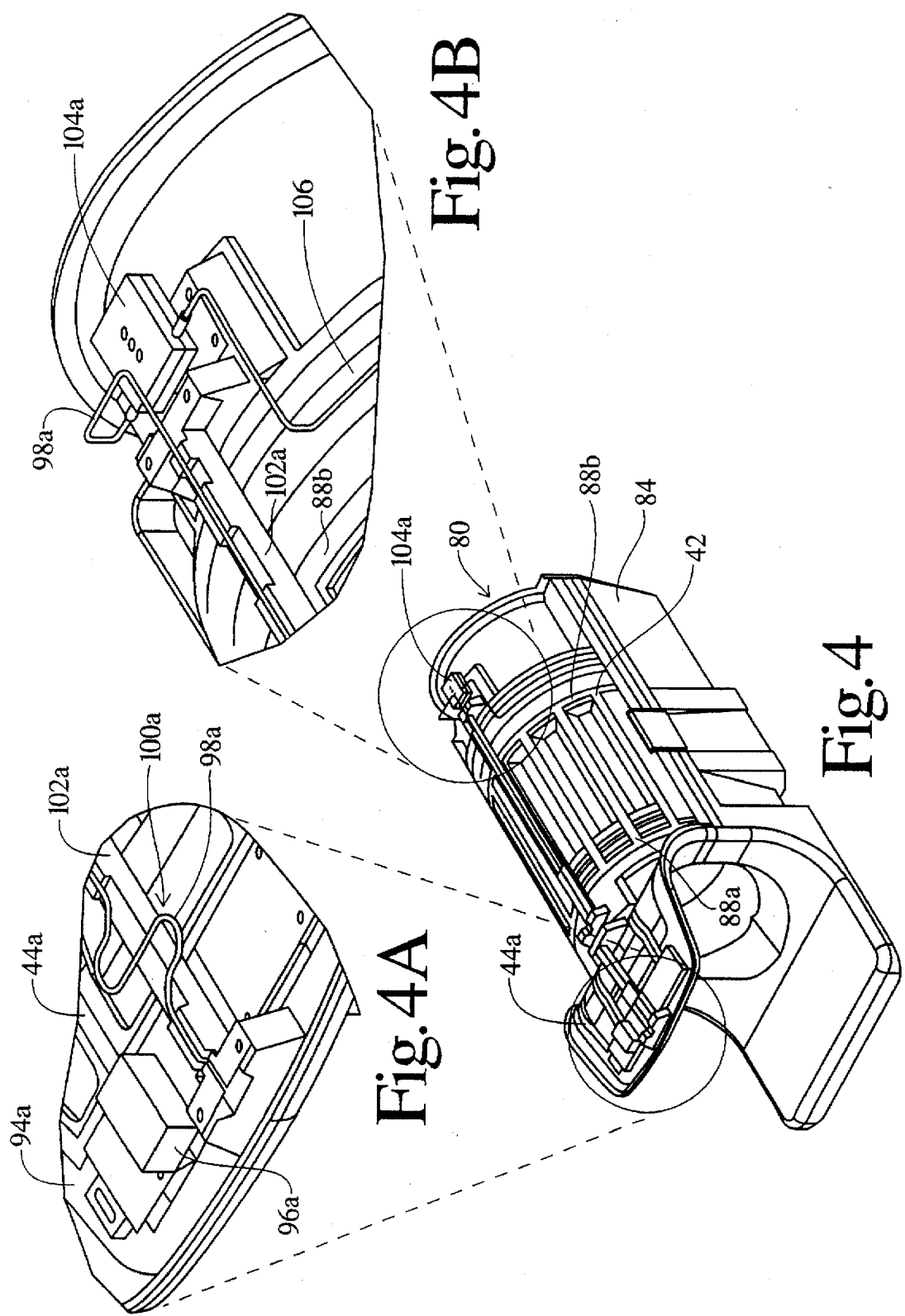

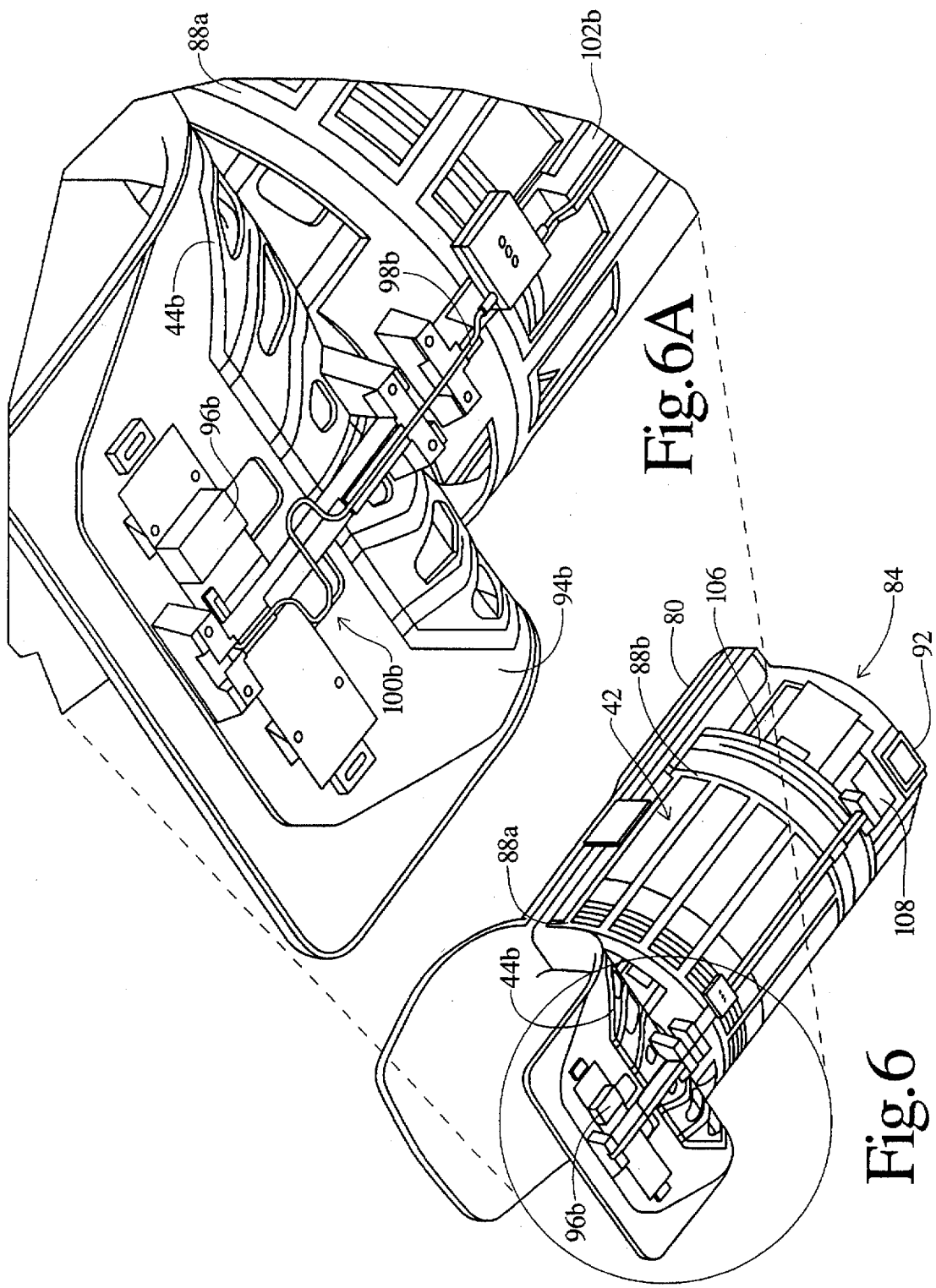

SPLIT-TOP, NECK AND HEAD VASCULAR ARRAY FOR MAGNETIC RESONANCE IMAGING

BACKGROUND OF THE INVENTION

The present invention relates to the magnetic resonance arts. It finds particular application in conjunction with split-top insertable radio frequency coils for magnetic resonance imaging of the head and neck and will be described with particular reference thereto. It is to be appreciated, however, that the present invention will also find application in other multiple coil techniques, spectroscopy, phased array coils, imaging for other than medical diagnostic purposes, and the like.

Conventionally, magnetic resonance imaging systems generate a strong, uniform static magnetic field $B_0$ in a free space or bore of a magnet. This main magnetic field polarizes the nuclear spin system of an object in the bore to be imaged. The polarized object then possess a macroscopic magnetic moment vector pointing in the direction of the main magnetic field. In a superconducting main magnet assembly, annular magnets generate the static magnetic field $B_0$, along a longitudinal or z-axis of the cylindrical bore.

To generate a magnetic resonance signal, the polarized spin system is excited by applying a radio frequency field $B_1$, perpendicular to the z-axis. Typically, a radio frequency coil for generating the radio frequency field is mounted inside the bore surrounding the sample or patient. In a transmission mode, the radio frequency coil is pulsed to tip the magnetization of the polarized sample away from the z-axis. As the magnetization precesses around the z-axis back toward alignment, the precessing magnetic moment generates a magnetic resonance signal which is received by the radio frequency coil in a reception mode.

For imaging, a magnetic field gradient coil is pulsed for spatially encoding the magnetization of the sample. Typically, the gradient magnetic field pulses include gradient pulses pointing in the z-direction but changing in magnitude linearly in the x, y, and z-directions, generally denoted $G_x$, $G_y$, and $G_z$, respectively. The gradient magnetic fields are typically produced by a gradient coil which is located inside the bore of the magnet and outside of the radio frequency coil.

Conventionally, when imaging the torso, a whole body radio frequency coil is used in both transmit and receive modes. By distinction, when imaging the head, neck, shoulders, or an extremity, the whole body coil is often used in the transmission mode to generate the uniform $B_1$ excitation field and a local coil is used in the receive mode. Placing the local coil close to the imaged region improves the signal-to-noise ratio and the resolution. In some procedures, local coils are used for both transmission and reception. One drawback to local coils it that they tended to be relatively small. The whole body coils are typically used for elongated regions, such as the spine. One technique for adapting surface coils for imaging an elongated region is illustrated in U.S. Pat. No. 4,825,162 of Roemer, in which a series of surface coils are lapped to construct a phased array.

Other radio frequency coil designs include a multi-modal coil known as the "birdcage" coil. See, for example, U.S. Pat. No. 4,692,705 of Hayes. Typically, a birdcage coil has a pair of end rings which are bridged by a plurality of straight segments or legs. In a primary mode, currents in the rings and legs are sinusoidally distributed which results in improved homogeneity along the axis of the coil. Homogeneity along the axis perpendicular to the coil axis can be improved to a certain extent by increasing the number of legs in the coil. Typically, a symmetric birdcage coil has eight-fold symmetry. Such a symmetric birdcage coil with N legs (where N is an even integer) exhibits N/2 mode pairs. The first (N/2)–1 mode pairs are degenerate, while the last mode pair is non-degenerate. The primary mode of such an eight-fold symmetric birdcage coil has two linear modes which are orthogonal to each other. The signals from these two orthogonal or quadrature modes, when combined, provide an increased signal-to-noise on the order of 40%. The simplest driven current pattern or standing waves defined by superpositions of degenerate eigenfunctions. For a low-pass birdcage of N meshes driven at is lowest non-zero eigenfrequency, the current in the n-th mesh is given by sin (2 πn /N+φ). The phase angle φ determines the polarization plane of the resulting $B_1$ radio frequency field and can be varied continuously by suitable application of driving voltages. The alignment and isolation of the two linear modes of a birdcage coil are susceptible to sample geometry. That is, the sample dominates the mode alignment and isolation between the two linear modes.

Birdcage coils, like other magnetic field coils, undergo mutual inductive coupling when positioned adjacent each other. As the coils approach each other, the mutual inductive coupling tends to increase until a "critical overlap" is reached. At the critical overlap, the mutual inductance drops to a minimum. As the coils are moved towards a complete coincidence from the critical overlap, the mutual inductive coupling again increases. See, "Optimized Birdcage Resonators For Simultaneous MRI of the Head and Neck", Leussler, SMRM, 12th Annual Meeting, Book of Abstracts, page 1349(1993).

In one multiple coil birdcage design, two birdcage coils have been overlapped to a point of minimum mutual inductance. A symmetric coil is used to image the head and an asymmetric coil was used to image the neck. Capacitive elements are added to provide the necessary phase shifting through the leg sections of unequal length. The coils are mounted in a rigid frame for optimum symmetry and a fixed geometric position. The coils are isolated from each other by the critical overlapping as well as by the addition of neutralization capacitors. See for example, U.S. Pat. No. 4,769,605 issued Sep. 6, 1988 to Timothy R. Fox.

Building an asymmetric coil design is fairly complicated and time-consuming. The phase shift from one section to another in the birdcage coil needs to be maintained for optimum coil performance. The critical overlapping between the two birdcage coils reduces the mutual coupling between the coils to a certain extent. Introducing different coil samples into the two birdcage coils alters the alignment of their linear modes and the mode isolation in either of the coils will change. This change, in turn, affects the symmetry and therefore the mutual coupling between the coils. The greater the mutual coupling between the coils, the larger the noise correlation between the coils and therefore the lower the combined signal-to-noise ratio. Electrical optimization of such a coil design is very complex. The tuning, matching, and isolation process is iterative and thus time-consuming. More specifically, the two linear modes of each birdcage coil need to be tuned, matched, and aligned to their respective coupling points on the coil and isolated from one another and from the two linear modes of the neck coils. Such a complex and iterative tuning, matching, and isolation process is not readily amenable to mass production.

"Novel Two Channel Volume Array Design For Angiography of the Head and Neck", Reykowski, et al., SMR 2nd Annual Meeting, Book of Abstracts, pp. 216 (1994), discloses a birdcage coil in combination with two volumetric Helmholtz coils arranged such that the $B_1$ fields of the two Helmholtz coils are diagonal and perpendicular to one another. The two quadrature combined outputs, one from the birdcage coil and one from the Helmholtz coils are interfaced to two channels of the system. By orienting the two Helmholtz coils such that their $B_1$ fields are orthogonal, coupling is reduced and the noise correlation therebetween held to a minimum. However, when these two volume coils are overlapped with a quadrature head coil, they experience the same difficulties discussed above in conjunction with the multiple birdcage coils. That is, when different sampled geometries are introduced, the isolation between the individual volume Helmholtz coils and the head coil change, causing a change in isolation, resulting in an increased noise correlation between all coils and a lower combined signal-to-noise ratio. Manufacturability of the coil is again complex and time-consuming.

The problem of coil interaction generally exists whenever two or more volume coils of different geometries are used. Electrical optimization of these coil designs is often complicated and iterative, hence time-consuming. Different sample geometries introduced into the designs alter coil-to-coil isolation, resulting in different noise correlations between the coils from one patient to another.

"Head and Neck Vascular Array Coil For MRI", Srinivasan, et al., SMR 2nd Annual Meeting, Book of Abstracts, pp. 1107(1994) and the applicants' co-pending earlier filed related U.S. patent application Ser. No. 08/343,635, filed Nov. 22, 1994 disclose a combination birdcage coil and quadrature volume coil pair. In the described coil design, the coils maintained different current distributions with preferred mode orientations independent of one another. The coil consists of a birdcage coil and a quadrature volume coil pair. The quadrature volume coil pair consists of at least two surface coils of the distributed type, that maintain preferred mode orientations with respect to one another at all times. The birdcage coil maintains an eight-fold symmetry; whereas, the surface coil maintains a two-fold symmetry. After a nominal overlap is achieved between the coils of this design, only one iteration of tuning is required to retune all coils to the magnetic resonance frequency.

The present invention provides a new and improved radio frequency coil which overcomes the above-referenced problems and others.

SUMMARY OF THE INVENTION

In accordance with one aspect of the present invention, a magnetic resonance apparatus is provided. A magnet generates a temporally constant, uniform magnetic field through an examination region. At least one radio frequency coil performs at least one of transmitting radio frequency signals into the examination region to induce and manipulate resonance of dipoles therein and receives radio frequency signals from the resonating dipoles. A processor processes the received magnetic resonance signals. The radio frequency coil is characterized by including a first volume coil assembly and a second volume coil assembly. The second volume coil assembly is disposed contiguous to and partially overlapping the first volume coil assembly in a common overlap region. A first electrical circuit is mounted adjacent to and connected with the second volume coil assembly. A first coaxial lead extends from the first electronic circuitry past and contiguous to the first volume coil assembly to a region on the opposite side of the first volume coil assembly from the second volume coil assembly. A first coil-to-coil decoupling circuit is connected with the first coaxial cable for inhibiting the first and second volume coil assemblies from communicating along the first coaxial cable.

In accordance with a more limited aspect of the present invention, the second volume coil assembly includes a first coil connected with the first electronic circuit and the first coaxial cable and a second coil. The second coil is connected with a second coaxial cable that extends from the second coil past and contiguous to the first volume coil assembly. A second coil-to-coil decoupling circuit is connected with the second coaxial cable for inhibiting the second coil and the first volume coil from coupling along the second coaxial cable.

In accordance with a yet more limited aspect of the present invention, the second coil-to-coil decoupling circuit is disposed in a common plane with the overlap region.

In accordance with another more limited aspect of the present invention, the first volume coil assembly includes a birdcage style coil and a guard ring disposed adjacent the birdcage style coil on a side opposite from the first volume coil assembly. The first coil-to-coil decoupling circuit is disposed on an opposite side of the guard ring from the birdcage coil.

In accordance with another more limited aspect of the present invention, the coil-to-coil decoupling circuits include a case having a spool-like cable guide therein about which the coaxial cable is looped to form an inductance. The case further has a pair of coaxial cable receiving shoulders for receiving the coaxial cable and locking it against longitudinal movement. At least one tuning capacitor is connected with the looped coaxial cable adjacent the cable-guide. An electrically conductive radio frequency shield shields the case.

In accordance with another aspect of the present invention, a method of magnetic resonance imaging is provided. A temporally constant uniform magnetic field is generated through a head and neck examination region. Magnetic field gradients are applied across the examination region. Radio frequency signals are transmitted into the examination region to induce and manipulate magnetic resonance of dipoles therein. Radio frequency signals are received from the resonating dipoles with a radio frequency coil assembly that has a first volume coil around the head region and a second volume coil around the neck region. The received radio frequency signals are processed into an image representation. The method is further characterized by the magnetic resonance signals from the resonating dipoles in the patient's head and neck regions being received concurrently with the first and second volume coils to generate a volumetric image representation of the head and neck region.

In accordance with a more limited aspect of the present invention, the second volume coil is operated alone to image only the neck region or the first neck coil is operated alone to image only the head region.

In accordance with another aspect of the present invention the first and second coils are tuned individually while separated. The first and second volume coils are overlapped and fixed in their overlapped state. After overlapping, the volume coils are retuned in a single iteration. Thereafter, a patient is received in the volume coils for imaging.

One advantage of the present invention is that it provides easy and efficient patient handling procedures.

Another advantage of the present invention resides in its ease of tuning, matching, and mode isolation adjustment.

The present invention is also advantageous due to it several operating modes.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 4 is a perspective view of the head coil of FIG. 1 with the top panel removed to illustrate the location of preamplifier, interface, and decoupling circuitry;

FIG. 4A is a detailed view of the anterior neck coil region of FIG. 4;

FIG. 4B is a detailed view of the coupling circuitry region of FIG. 4;

FIG. 6 is a perspective view of the head coil of FIG. 1 viewed from below with the lower casing removed to expose interconnect and decoupling circuitry location;

FIG. 6A is a detailed view of the posterior neck coil and decoupling circuit region of FIG. 6;

DETAILED DESCRIPTION OF THE PREFERRED EMBODIMENTS

Figure 1:
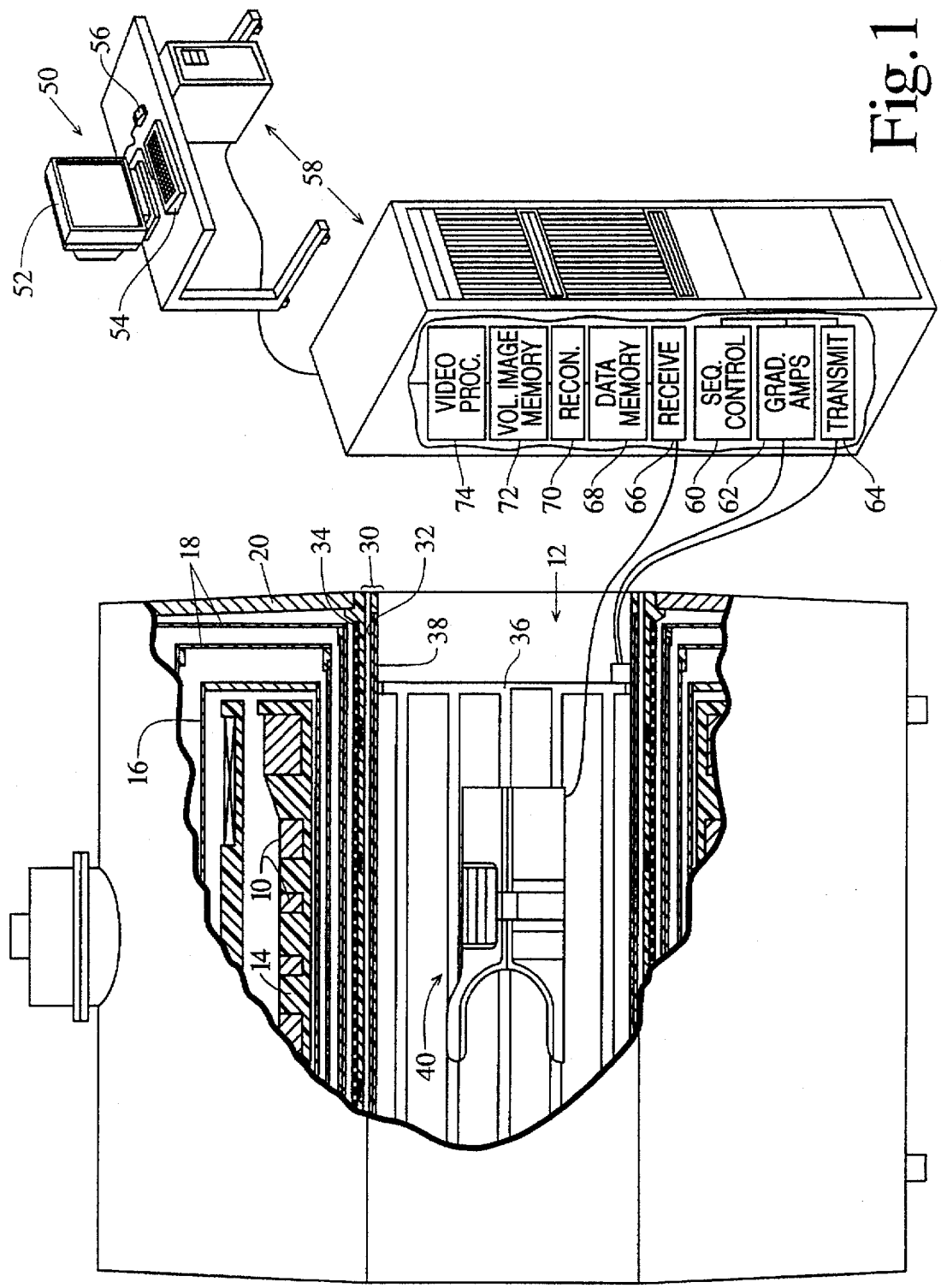
FIG. 1 is a diagrammatic illustration of a magnetic resonance imaging system with an insertable head and neck coil in accordance with the present invention.

With reference to FIG. 1, a plurality of primary magnetic coils 10 generate a uniform, temporally constant magnetic field $B_0$ along a longitudinal or z-axis of a central bore 12. In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum dewar 20. Of course, annular resistive magnets, C-magnets, and the like are also contemplated.

A whole body gradient coil assembly 30 includes x, y, and z-coils mounted along the bore 12 for generating gradient magnetic fields, $G_x$, $G_y$, and $G_z$. Preferably, the gradient coil assembly is a self-shielded gradient coil that includes primary x, y, and z-coil assemblies 32 potted in a dielectric former and secondary x, y, and z-coil assemblies 34 that are supported on a bore defining cylinder of the vacuum dewar 20. A whole body radio frequency coil 36 is mounted inside the gradient coil assembly 30. A whole body radio frequency shield 38, e.g., copper mesh, is mounted between the whole body RF coil 36 and the gradient coil assembly 30.

An insertable radio frequency coil 40 is removably mounted in the bore in an examination region defined around an isocenter of the magnet 10. In the embodiment of FIG. 1, the insertable radio frequency coil is a head and neck coil for imaging one or both of patient's head and neck.

An operator interface and control station includes a human-readable display, such as a video monitor 52, and an operator input means including a keyboard 54, a mouse 56, a trackball, light pen, or the like. A computer control and reconstruction module 58 includes hardware and software for enabling the operator to select among a plurality of preprogrammed magnetic resonance sequences that are stored in a sequence control memory. A sequence controller 60 controls gradient amplifiers 62 connected with the gradient coil assembly 30 for causing the generation of the $G_x$, $G_y$, and $G_z$ gradient magnetic fields at appropriate times during the selected gradient sequence and a digital transmitter 64 which causes a selected one of the whole body and insertable radio frequency coils to generate $B_1$ radio frequency field pulses at times appropriate to the selected sequence.

Resonance signals received by the coil 40 are demodulated by a digital receiver 66 and stored in a data memory 68. The data from the data memory are reconstructed by a reconstruction or array processor 70 into a volumetric image representation that is stored in an image memory 72. The image is reconstructed from the birdcage and quadrature coil signals when a combined head and neck image is wanted. Alternately, signals from the head and neck coils can be reconstructed separately to make separate images. It is to be appreciated, that for a reconstruction processor and image memory that has a fixed size, e.g., 1024×1024×1024, that the resolution of the resultant image will be higher when the imaged volume is smaller. A video processor 74 under operator control converts selected portions of the volumetric image representation into slice images, projection images, perspective views, or the like as is conventional in the art for display on the video monitor.

Figure 2:
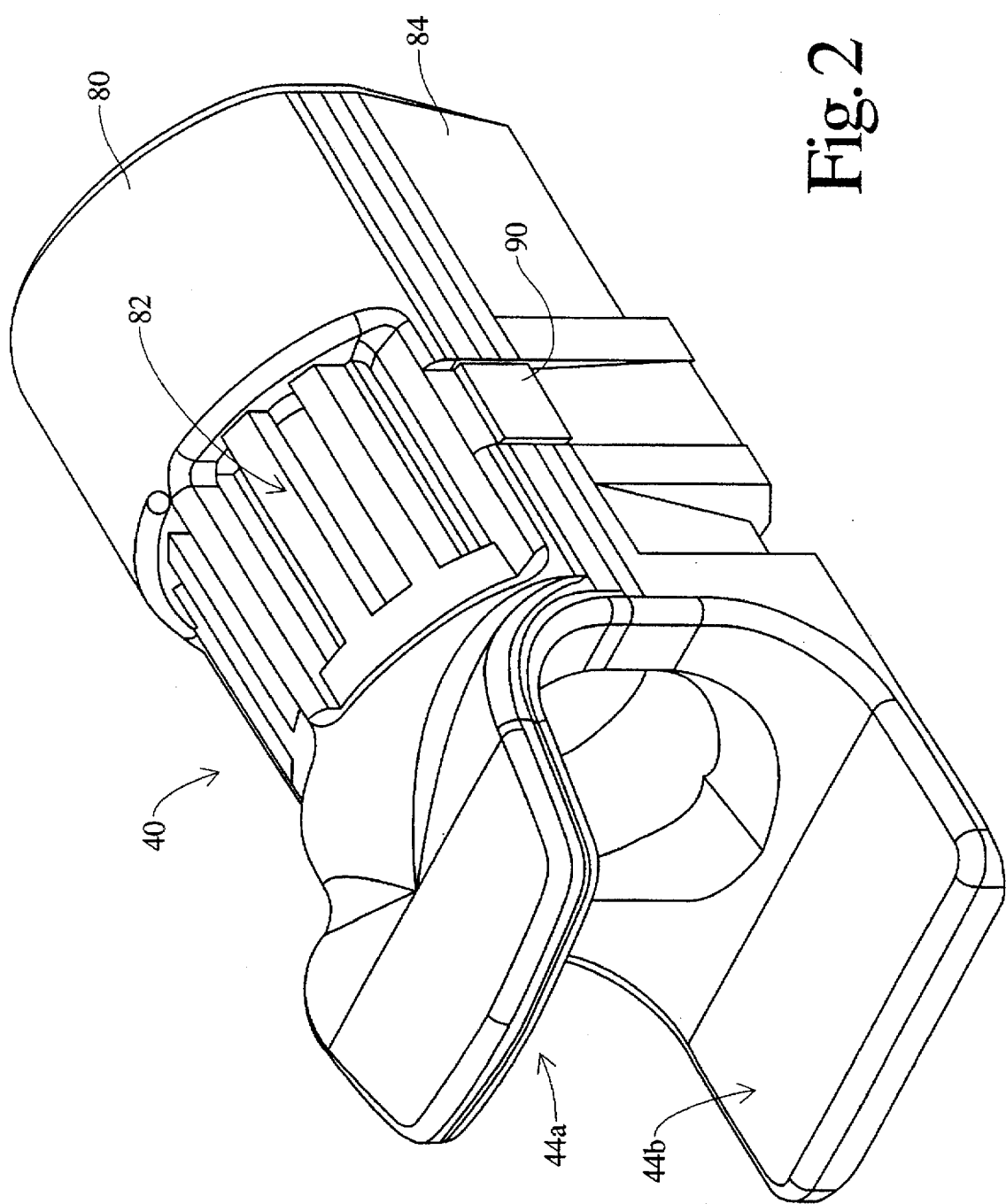
FIG. 2 is a perspective view of the head and neck coil of FIG. 1.
Figure 3:
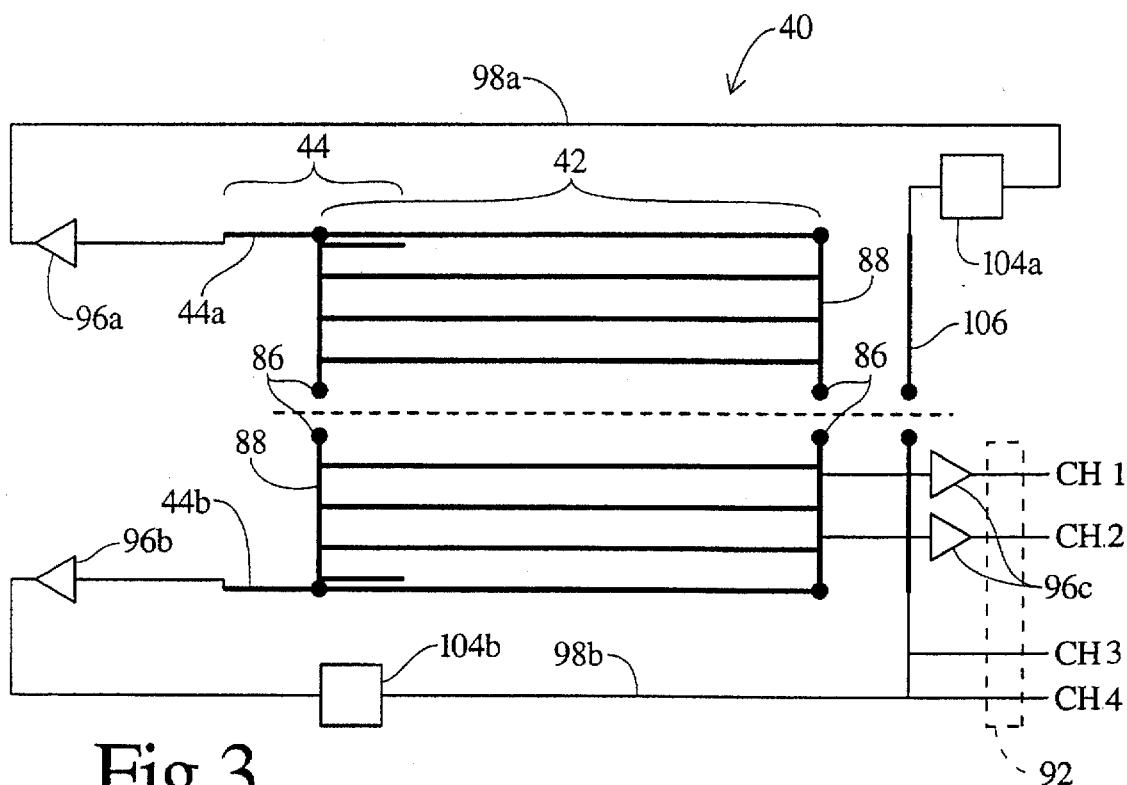
FIG. 3 is an electrical diagram and side view of the head coil of FIG. 1 and associated preamplifier and decoupling circuitry.

With continuing reference to FIG. 1 and further reference to FIGS. 2 and 3, the preferred insertable radio frequency coil 40 includes a birdcage coil 42 and a quadrature coil pair 44 including an upper or anterior coil 44a and a lower or posterior coil 44b. The patient's head is received within the birdcage coil with the anterior coil 44a wrapping around the patient's upper shoulder onto the patient's chest and the posterior coil 44b wrapping around the lower side of the patient's shoulders and along the patient's back. Each of the coils has outputs for two linear modes, preferably orthogonal modes. The birdcage coil and the coils in the quadrature coil pair have capacitors or inductive elements added at appropriate locations such that each operates in a low pass, high pass, band pass, or band stop configuration.

In the preferred split-top embodiment, an upper half of the birdcage coil and the anterior coil are housed in a first or removable housing portion 80. To reduce claustrophobic effects on the patient, the upper housing portion has windows 82 between adjacent legs of the birdcage coil. The upper housing portion is removably received on a lower housing portion 84 which rests on the patient support. The upper and lower housing portions are interconnected by mechanical pins or connectors (not shown). Electrical connectors 86, such as pin, contacts, capacitive couplings, or the like, which may be the same as the mechanical pin or connector assemblies, electrically interconnect end rings 88a, 88b of the birdcage coil 42. Preferably, a mechanical latch 90 holds the first and second portions of the insertable coil assembly together. Adapter tabs or other interconnectors (not shown) are associated with the insertable coil and the patient support to assure accurate alignment of the head coil assembly with the magnetic resonance system. An electrical plug or socket 92 is disposed adjacent a rear end of the insertable coil for interconnection with a matching socket or plug arrangement in the patient support. This enables built-in cable handling assemblies to be provided below the patient support to facilitate operation and use. Although not shown, it is understood that pads are also provided within the coil to immobilize the patient during scanning and to help with patient comfort.

The upper and lower coil portions include formers on which copper foil coils are supported, e.g., fiber reinforced plastic. The coil formers are fastened to inner portions of the housing for rigidity and for maintaining the coil's shape and structural integrity. Initially, the head coil formers are fixed to the housing. During manufacture and initial calibration, the neck coil formers and the carried neck coil 44 are shifted until a point of minimum mutual inductance with the head coil 42 is reached. At this point, the neck coil formers are fixed to the head coil formers, fixing the relative positions of the neck and head coils. The inner housings are contoured to fit the anatomy under investigation. The outer housings cover the internal parts and electronic assemblies, as well as provide mechanical strength to the coil construction. Between the inner and outer housings, skeletons are provided to add rigidity to the coil structure.

Figure 5:
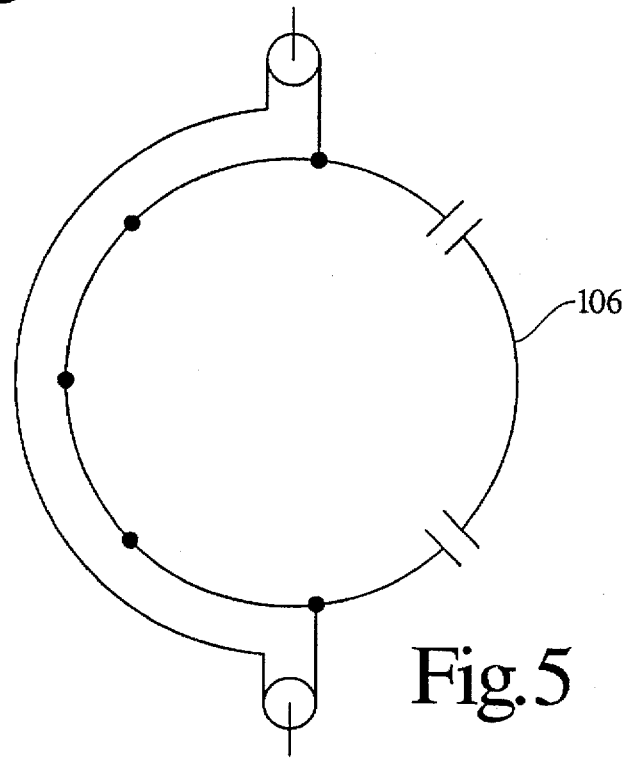
FIG. 5 is a diagrammatic view illustrating the effective electrical circuitry taken cross-sectionally through the guard ring of FIG. 3.

With particular reference to FIGS. 3, 4, 4A and 4B, the head portion of the coil is of a birdcage design. The anterior neck coil 44a is etched on a flexible PC board 94a and mounted on its respective coil former. The coil former and PC board are fastened into the upper housing 80 after the appropriate overlap has been set. The PC board also carries an electronic assembly 96a including matching and decoupling electronics, a preamplifier protection circuit, a preamplifier, and a coaxial cable support assembly. The anterior neck coil is tuned and matched to the magnetic resonance frequency prior to overlapping with the birdcage coil 42. A 50 Ohm coaxial cable 98a passes through an S-shaped or extension region 100a, rides on a support bridge 102a that originates on the anterior neck side and extends along a central plane of the birdcage head coil, and connects to a decoupling circuit 104a. The decoupling circuit is located beyond or rearward of a guard ring 106 of the birdcage coil. The shield of the coaxial cable past the anterior decoupling circuit 104a is connected to the guard ring. As illustrated in FIG. 5, the anterior coaxial cable navigates over the guard ring to the bottom of the coil assembly to an interconnect or output board 108 and the plug or socket With particular reference to FIGS. 6 and 6A, the posterior neck coil 44b is etched on a circuit board 94b which is fastened to its respective former. The former is adjustably positioned, then fixed to become an integral part of the lower housing portion 84. An electronic circuit 96b is mounted on the posterior coil circuit board 94b. The circuit again includes matching and decoupling electronics, a preamplifier protection circuit, and a preamplifier. A coaxial cable 98b extends from the posterior circuitry 96b through an S-shaped expansion region 100b along a central plane of the birdcage head coil on a bridge 102b to a posterior decoupling circuit which is disposed in the plane of the overlap between the birdcage head coil 42 and the posterior neck coil 44b. The coaxial cable 98b further extends from the decoupling circuit to the interconnect board 108. The shield of the posterior coaxial cable is again connected with the guard ring 106 thus shorting them together.

Figure 7:
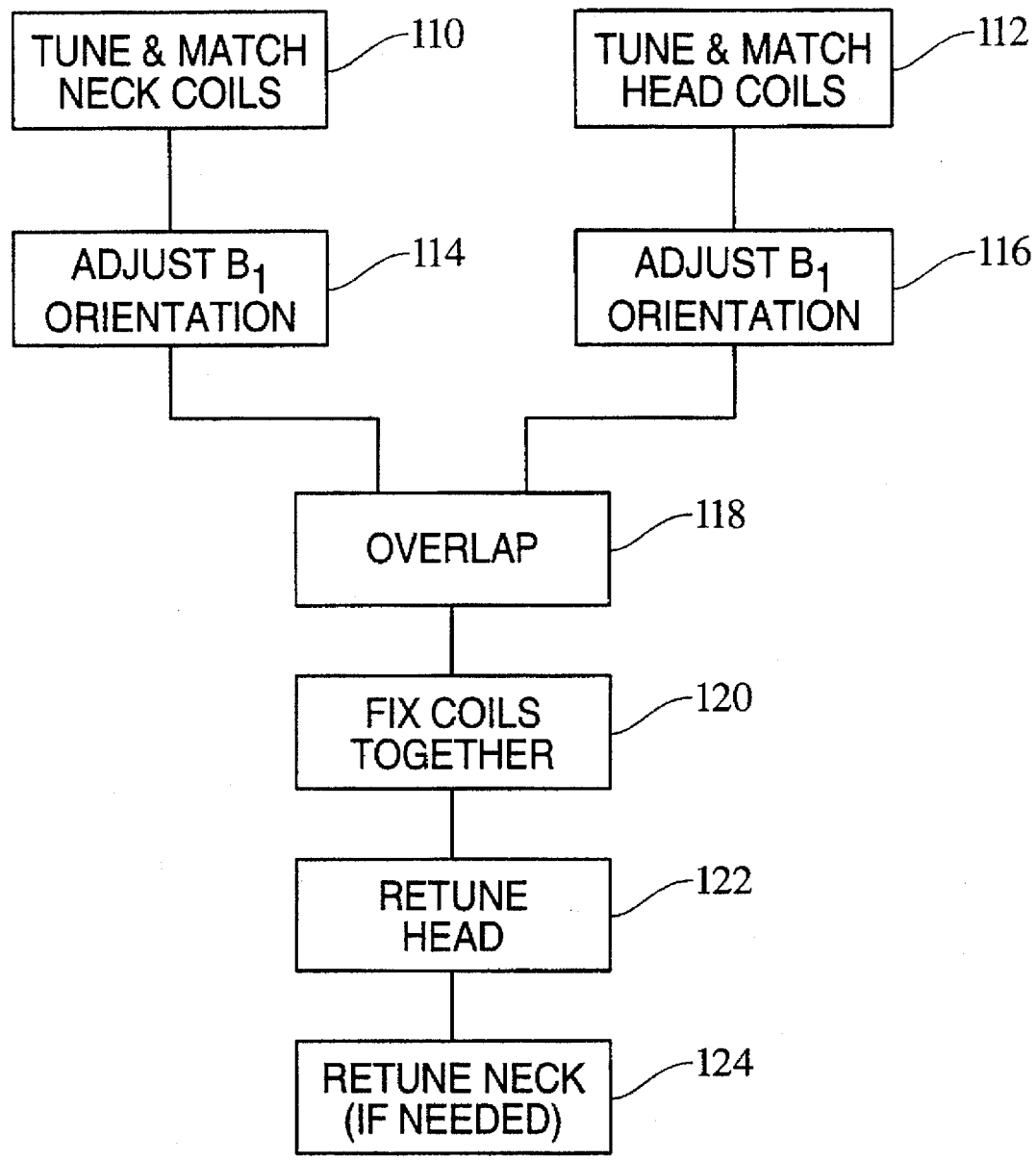
FIG. 7 is a flow chart illustrative of a preferred manufacturing procedure.

With reference to FIG. 7, the neck and birdcage coils are each tuned 110, 112 and the orientation of their $B_1$ fields is adjusted 114, 116. The tuned coils are overlapped 118 a selected amount, e.g., to a point of minimum mutual inductance. The S-shaped extension region 100a, 100b of the cables facilitate ready positioning of circuit boards 94a, 94b relative to the birdcage coil. Once overlapped to the selected point, the coils are fixed together 120. The birdcage coil and the neck coils are retuned 122, 124 in a single iteration to the magnetic resonance frequency. In most cases, the birdcage coil needs most of the retuning and the neck coil little or none. The extent of the retuning depends mainly on the proximity of the coaxial cables 98a and 98b to the birdcage coil 42. In most cases, the neck coil frequencies remain the same. Because only one iteration is needed to retune all coils to the same magnetic resonance frequency after achieving the selected overlap, the number of steps needed for optimization during manufacturing is reduced.

Figure 8A:
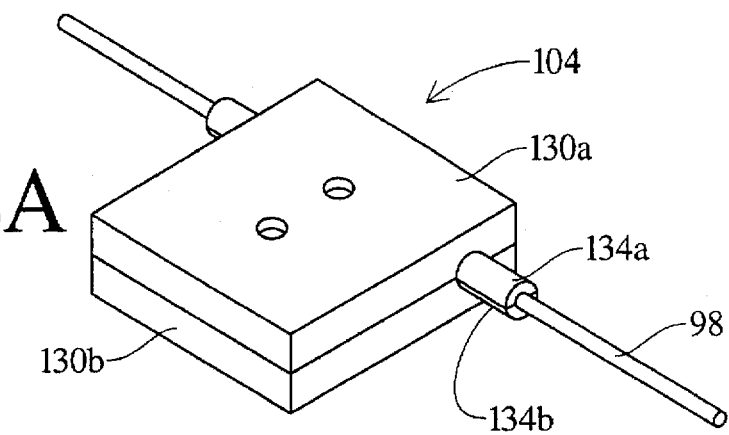
FIG. 8A is a perspective view of an exemplary one of the decoupling circuitry of the preceding Fgirues.
Figure 8B:
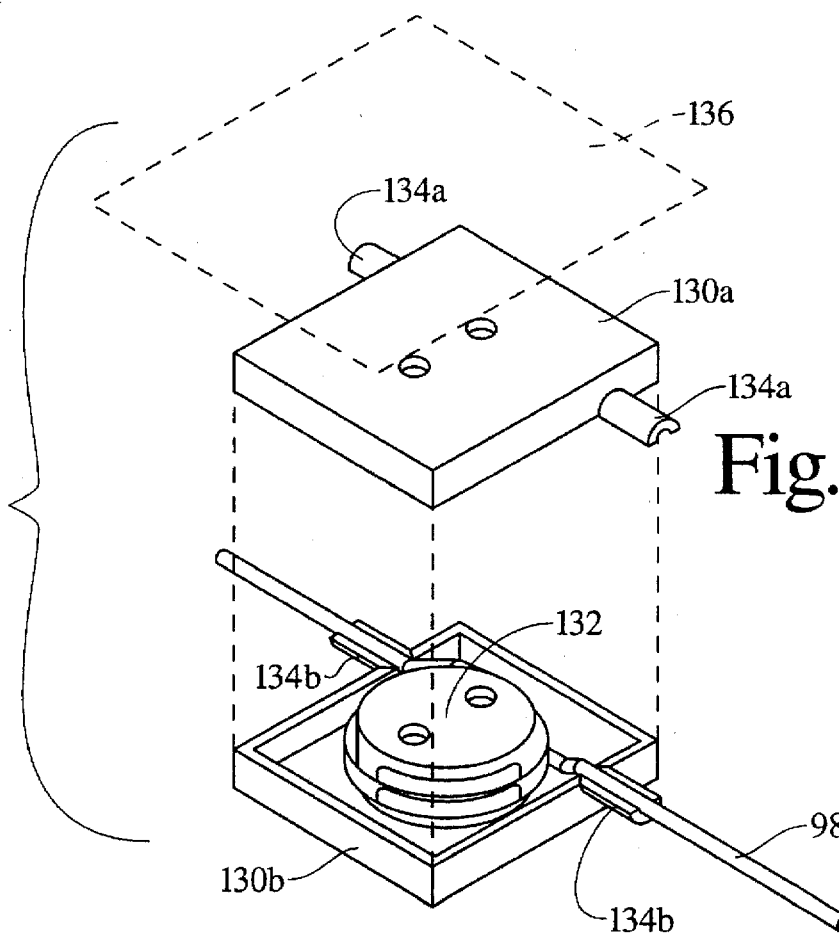
FIG. 8B is a perspective view of the decoupling circuit of FIG. 8A with the cover removed to show internal detail.
Figure 8C:
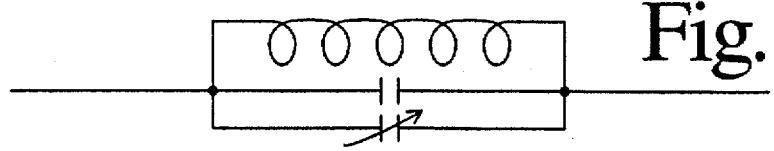
FIG. 8C is an equivalent circuit of the decoupling circuit of FIGS. 8A and 8B.

With reference to FIGS. 8A, 8B, and 8C, the anterior and posterior decoupling circuits 104a and 104b each include a housing having a top cover 130a and a bottom cover 130b within which a circular spool 132 is supported. The coaxial cable extends through a first immobilizer or guide 134a, around the spool, and exits by a second immobilizer or guide 134b. Fixed and variable capacitors are soldered across the turn(s) of the coaxial cable to tune the decoupling circuits close to the magnetic resonance frequency. When the top and bottom covers are closed, the immobilizers grip the coaxial cable sufficiently tightly that it is locked against sliding into or out of the housing. The immobilizers not only reduce any torque from being transmitted to the electronics within the decoupling circuit, but also protect against changes in inductance due to changes in the tightness of the winding around the spool. After the decoupling circuit housing is closed, a sheet of copper foil 136 is wrapped around the housing and the immobilizers. Once the decoupling circuit is positioned in place, the foil is pierced through a small hole 138 to gain access to a trimming capacitor and the decoupling circuit is tuned to the magnetic resonance frequency. After fine tuning, the access opening to the trimming capacitor is foil covered as well. The foil covering functions as a radio frequency shield to isolate the decoupling tank circuit (FIG. 8C) for efficient decoupling circuit operation.

Tuning the decoupling circuits to the magnetic resonance frequency serves two major functions. The primary function is to present a high impedance (Z) for currents flowing in the shields of the coaxial cables during RF transmit. This prevents the formation of closed loops inside the magnet bore. The second function of each decoupling circuit is slightly different. The posterior neck coil has its second mode tuned to the magnetic resonance frequency. The posterior decoupling circuit isolates the currents flowing in the region where the shield of the coaxial cable is exposed to the birdcage coil from the currents flowing in the shield exposed to the posterior neck coil.

For the coaxial cable 98a above the anterior neck coil 44a, the central plane is a plane of symmetry. That is, the central plane is a virtual ground. The anterior neck coil has its first, primary mode tuned to the magnetic resonance frequency. The anterior coaxial cable is transparent to the anterior neck coil. However, when the coaxial cable is guided across the birdcage coil 42, the cable is no longer at a virtual ground plane and currents are induced in its shield. These circulating currents are substantially attenuated by the anterior decoupling circuit 104a. Again, the anterior decoupling circuit is before the guard ring 106 of the birdcage coil. This stops induced RF currents on the shield of the anterior coaxial cable from being communicated to the guard ring through the shorting connection. The guard ring is also broken by shorting capacitors (not shown) to reduce gradient induced eddy currents. The decoupling circuits are shielded to minimize their interaction with the body coil 36 during RF transmit, with the individual coils in the insertable coil 40, and to reduce any irradiation segments of shields of the straight segments of the coaxial cable.

Additional decoupling circuits may also be employed to provide further barriers to the transmission of stray radio frequency signals. If the decoupling circuits are eliminated completely, the coaxial cables would carry currents in their shields. Further, the interaction between the coils in the array would not be minimized. Rather, the two coils would talk to each other through the shield, causing a disadvantageous transfer of noise between the coils. The presence of the decoupling circuits as illustrated maintains the signal-to-noise ratio of the coils in its different operating modes within a few percent. The signal-to-noise ratio and uniformity of the illustrated insertable coil is similar to that of a standard quadrature head coil without neck coils. The signal-to-noise ratio of the posterior neck coil is similar to that of a C-spine element in a cervical-thoracic-lumbar array coil. However, the coverage of the neck coils is greater in the present design.

The coil has three modes—(1) head and neck, (2) head only, and (3) neck only. See TABLE 1 below. In the head and neck mode, the birdcage head coil and the neck coils are operated together to image from the aortic arch to the top of the head. In the head and neck mode, the signal-to-noise ratio is still high as is the $B_1$ homogeneity. This head and neck imaging mode enables blood flow to be measured and monitored as it flows from the aortic arch beyond the circle of Willis in the brain in a single image. This high signal-to-noise ratio and uniform coverage is important in the imaging of skull-base tumors that are difficult to image with either a head coil alone or a neck coil alone. The neck coils 44 are decoupled during the head only mode and the head coil 42 is decoupled during the neck only mode.

TABLE 1

| Operating Modes | CH1 | CH2 | CH3 | CH4 |
| --- | --- | --- | --- | --- |
| Head Only | ON | ON | OFF | OFF |
| Neck Only | OFF | OFF | ON | ON |
| Head/Neck | ON | ON | ON | ON |

The coils 42, 44 are actively decoupled during body transmit. The coil is interfaced to the magnetic resonance system via an interface, such as the interface shown in U.S. application Ser. No. 08/286,780, filed Aug. 5, 1994. Individual channel device drivers in the system transmit/receive interface circuit are programmed to provide different sets of voltages in the three operating modes for the insertable radio frequency coil 40, viz, the head only, neck only, and head and neck mode. In the head mode, the neck coils are actively decoupled and only the head coil is resonant at the magnetic resonance frequency. Similarly, in the neck mode, the head coil is actively decoupled and only the neck coils are resonant at the magnetic resonance frequency. In the head and neck mode, all coils in the insertable radio frequency coil 40 are resonant at the larmor frequency and receive magnetic resonance signals.

It is to be appreciated that various linear or quadrature surface coils may be overlapped with the birdcage coil. Such surface coils are preferably shaped in conformity with the surface of the subject adjacent the region of interest.

The electrical circuits 96a, 96b of the preferred embodiment include a preamplifier and output for the anterior neck coil and a preamplifier and output for the posterior neck coil. A birdcage coil output circuit 96c includes two preamplifiers connected to the birdcage coil to provide 90°, quadrature outputs. These four preamplified signals in the illustrated embodiment are conveyed to the radio frequency receiver 66 which demodulates the four resonance signals. Alternately, the quadrature resonance signals can be shifted by 90° and combined at the insertable coil rather than after demodulation. As yet another alternative, the signals can be digitized at the surface coil and digital signals sent to the receiver.

Figure 9:
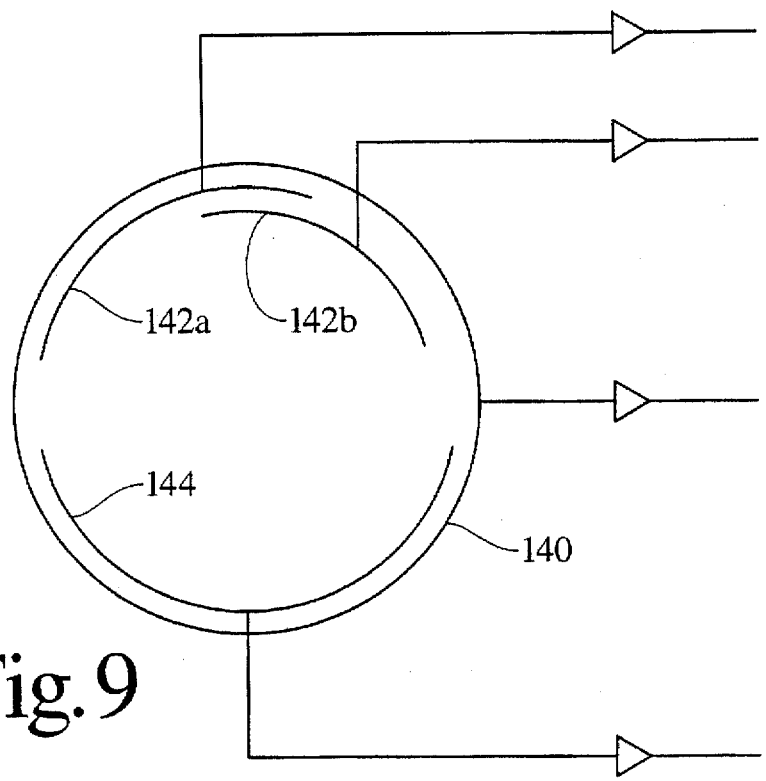
FIG. 9 is a diagrammatic illustration of an alternate embodiment of the present invention; and, FIG. 10 is a diagrammatic illustration of yet another alternate embodiment of the present invention.

In the above-described preferred embodiment, the birdcage coil has eight-fold symmetry and the neck coils two-fold symmetry. However, other symmetries are also contemplated. In the embodiment of FIG. 9, a birdcage coil 140 is again utilized to provide uniform coverage over the brain. A pair of loop-type anterior neck coils 142a, 142b are positioned over the patient. A distributed type posterior neck coil 144 is positioned below the patient's neck. This coil combination is operable in a head-only mode, a neck-only mode, a posterior neck-only mode, an anterior neck and arch-only mode, a left or right interior neck-only mode, a neck and head combined mode, or a combination of the above.

Figure 10:
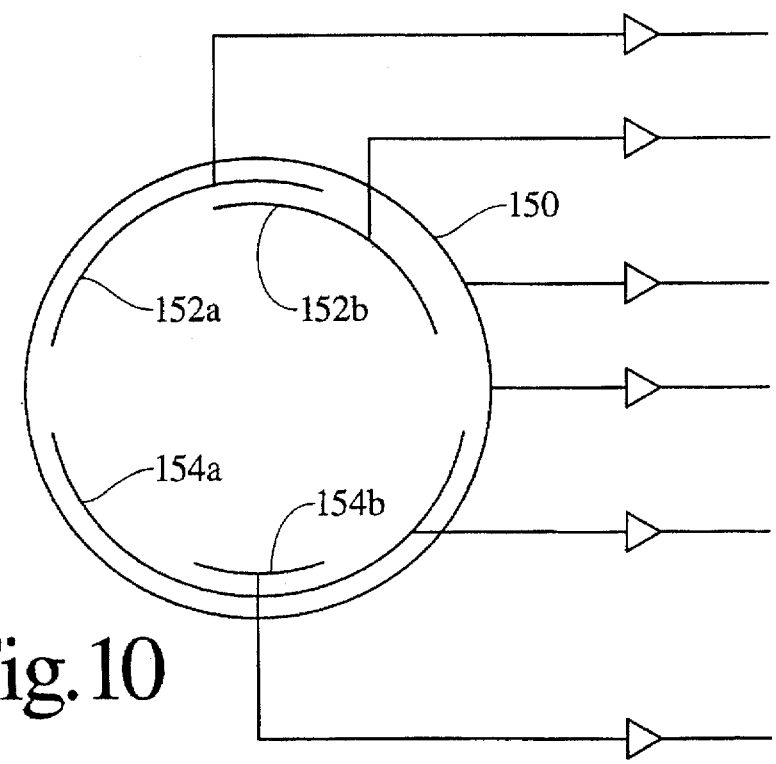

With reference to FIG. 10, a birdcage coil 150 with a pair of quadrature outputs provides uniform head coverage. Two loop type coils 152a, 152b provide anterior neck and arch coverage. Helmholtz and loop type coils 154a, 154b provide uniform posterior neck coverage. The birdcage, the anterior neck coils, and the posterior neck coils may each be interfaced with one or two channels of the receiver to operate singly or in various combinations as discussed above. Other alternate embodiments include birdcage coils that have other than eight-fold symmetry and neck coils with other than two-fold symmetry. The birdcage coil may be circularly cylindrical, elliptically cylindrical, or have other geometries. The neck coil is contoured in such a way as to provide a high signal-to-noise ratio and uniform coverage over its imaging field of view. The coils in the volume quadrature pair can also be of the loop type, Helmholtz type, Figure-8 type, distributed type, or combinations thereof. The signals from the individual coils can be combined prior to or after quadrature combination or prior to or after preamplification. The signals may also be combined digitally post-data acquisition. As another alternative, the individual coils may be tuned to one or more selected magnetic resonance frequencies. In yet another alternate embodiment, the birdcage volume coil is combined with several quadrature pairs in a cascade manner to cover an elongated anatomy under investigation. Decoupling circuits of other designs for inhibiting the flow of radio frequency currents and different numbers of decoupling circuits may also be utilized. The insertable coil need not be in a split mechanical package. For example, the coil may be slid over the patient's head and neck or other portions of the patient's anatomy as may be appropriate to the coil design and application.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance apparatus which includes a magnet for generating a temporally constant, uniform magnetic field through an examination region, a radio frequency coil which performs at least one of (1) transmitting radio frequency signals into the examination region to induce and manipulate resonance of dipoles disposed therein and (2) receiving radio frequency signals from resonating dipoles in the examination region, and a processor for processing the received magnetic resonance signals, the radio frequency coil including:

a first volume coil assembly;

a second volume coil assembly disposed contiguous to and only partially overlapping the first volume coil assembly in a common overlap region;

a first electronic circuit mounted adjacent to and connected with the second volume coil assembly;

a first coaxial cable extending from the first electronic circuit past and contiguous to the first volume coil assembly, to a region on an opposite side of the first volume coil assembly from the second volume coil assembly;

a first coil-to-coil decoupling circuit connected with the first coaxial cable for inhibiting the first and second volume coil assemblies from coupling to each other along the first coaxial cable when receiving the radio frequency signals from the resonating dipoles in the examination region.

2. In the magnetic resonance apparatus as set forth in claim 1, the second coil assembly including a first coil connected with the first coaxial cable and a second coil, the radio frequency coil further including:

a second electronic circuit disposed adjacent to and contiguous with the second coil;

a second coaxial cable extending from the second coil past and contiguous to the first coil assembly to the opposite side thereof;

a second coil-to-coil decoupling circuit connected with the second coaxial cable for inhibiting the second coil and the first coil assembly from coupling along the second coaxial cable.

3. In the magnetic resonance apparatus as set forth in claim 2, the second coil-to-coil decoupling circuit is disposed in a common plane with the overlap region.

4. In a magnetic resonance apparatus which includes a magnet for generating a temporally constant, uniform magnetic field through an examination region, at least one radio frequency coil which performs at least one of (1) transmitting radio frequency signals into the examination region to induce and manipulate resonance of dipoles disposed therein and (2) receiving radio frequency signals from resonating poles in the examination region, and a processor for processing the received magnetic resonance signals, the radio frequency coil including a first coil assembly, the first coil assembly including a birdcage style coil and further including a guard ring disposed adjacent the birdcage style coil;

a first electronic circuit mounted adjacent to and connected with the second coil assembly;

a first coaxial cable extending from the first electronic circuit past and contiguous to the first coil assembly, to a region on an opposite side of the first coil assembly;

second coil assembly disposed contiguous to and only partially overlapping the first coil assembly in a common overlap region;

a second electronic circuit disposed adjacent to and contiguous with the second coil;

a second coaxial cable extending from the second coil past and contiguous to the first coil assembly to the opposite side thereof, sheaths of the first and second coaxial cables being electrically connected with the guard ring; and a first coil-to-coil decoupling circuit connected with the first coaxial cable for inhibiting the first and second coil assemblies from coupling along the first coaxial cable, the first coil-to-coil decoupling circuit being disposed on an opposite side of the guard ring from the birdcage style coil.

5. In the magnetic resonance apparatus as set forth in claim 2, the second coil-to-coil decoupling electronic circuit being disposed substantially in a common plane with the overlap region.

6. In a magnetic resonance apparatus which includes a magnet for generating a temporally constant, uniform magnetic field through an examination region, a radio frequency coil which performs at least one of (1) transmitting radio frequency signals into the examination region to induce and manipulate resonance of dipoles disposed therein and (2) receiving radio frequency signals from resonating dipoles in the examination region, and a processor for processing the received magnetic resonance signals, the radio frequency coil including:

a first coil assembly;

a first electronic circuit mounted adjacent to and connected with the second coil assembly;

a first coaxial cable extending from the first electronic circuit past and contiguous to the first coil assembly;

a second coil assembly disposed contiguous to and partially overlapping the first coil assembly in a common overlap region, including a first coil connected with the first coaxial cable and a second coil;

a second electronic circuit disposed adjacent to and contiguous with the second coil;

a second coaxial cable extending from the second coil past and contiguous to the first coil assembly to an opposite side thereof;

a first coil-to-coil decoupling circuit connected with the first coaxial cable for inhibiting the first and second coil assemblies from coupling along the first coaxial cable;

a second coil-to-coil decoupling circuit connected with the second coaxial cable for inhibiting the second coil and the first coil assembly from coupling along the second coaxial cable;

a lower housing portion which supports the second coil, a lower part of the first coil assembly, the second electronic circuit, and the second decoupling circuit;

an upper housing portion which supports the first coil, an upper part of the first coil assembly, the first electronic circuit, and the first decoupling circuit, the upper and lower housing portions being selectively mechanically couplable to provide a unitary coil construction and decouplable to facilitate patient access; and, electrical connections for interconnecting the upper and lower parts of the first coil assembly.

7. In a magnetic resonance apparatus which includes a magnet for generating a temporally constant, uniform magnetic field through an examination region, a radio frequency coil which performs at least one of (1) transmitting radio frequency signals into the examination region to induce and manipulate resonance of dipoles disposed therein and (2) receiving radio frequency signals from resonating dipoles in the examination region, and a processor for processing the received magnetic resonance signals, the radio frequency coil including:

- a first volume coil assembly;
- a second volume coil assembly disposed contiguous to and partially overlapping the first coil assembly in a common overlap region;
- an electronic circuit mounted adjacent to and connected with the second coil assembly;
- a coaxial cable extending from the first electronic circuit past and contiguous to the first coil assembly, to a region on an opposite side of the first coil assembly from the second coil assembly;
- a coil-to-coil decoupling circuit connected with the first coaxial cable for inhibiting the first and second coil assemblies from coupling along the first coaxial cable, the coil-to-coil decoupling circuit including:
  - a case having a spool-like construction therein, the case having coaxial cable receiving guides for receiving the coaxial cable and locking the coaxial cable against longitudinal movement, the coaxial cable being wrapped around the spool to form an inductance and being interconnected with at least one adjustable tuning capacitor;
  - an electrically conductive layer for coating and shielding the case.

8. In a magnetic resonance apparatus which includes a magnet for generating a temporally constant, uniform magnetic field through an examination region, a radio frequency coil which performs at least one of (1) transmitting radio frequency signals into the examination region to induce and manipulate resonance of dipoles disposed therein and (2) receiving radio frequency signals from resonating dipoles in the examination region, and a processor for processing the received magnetic resonance signals, the radio frequency coil including:

- a first coil assembly, the first coil assembly being at least four-fold symmetric;
- a second coil assembly disposed contiguous to and partially overlapping the first coil assembly in a common overlap region, the second coil assembly being at least two-fold symmetric;
- an electronic circuit mounted adjacent to and connected with the second coil assembly;
- a coaxial lead extending from the electronic circuit past and contiguous to the first coil assembly, to a region on an opposite side of the first coil assembly from the second coil assembly;
- a coil-to-coil decoupling circuit connected with the coaxial lead for inhibiting the first and second coil assemblies from coupling along the first coaxial lead.

9. A radio frequency coil for at least receiving magnetic resonance signals, the radio frequency coil comprising:

- a first volume coil assembly;
- a second volume coil assembly disposed contiguous to and partially overlapping the first volume coil assembly in an overlap region;
- a coaxial lead extending from the second volume coil assembly, along the first volume coil assembly, to a region on an opposite side of the first volume coil assembly from the second volume coil assembly;
- a coil-to-coil decoupling circuit connected with the coaxial lead for inhibiting the first and second volume coil assemblies from coupling to each other along the coaxial cable while receiving the magnetic resonance signals such that cross-talk between the first and second volume coil assemblies is inhibited.

10. A radio frequency coil for at least receiving magnetic resonance signals, the radio frequency coil comprising:

- a first coil assembly, the first coil assembly being at least four-fold symmetric;
- a second coil assembly disposed contiguous to and partially overlapping the first coil assembly in an overlap region, the second coil assembly being at least two-fold symmetric;
- a coaxial lead extending from the second coil assembly, along the first coil assembly, to a region on an opposite side of the first coil assembly from the second coil assembly;
- a coil-to-coil decoupling circuit connected with the coaxial cable for inhibiting the first and second coil assemblies from coupling along the coaxial cable.

11. A radio frequency coil for at least receiving magnetic resonance signals, the radio frequency coil comprising:

- a first coil assembly, the first coil assembly including a birdcage coil and a guard ring;
- a second coil assembly disposed contiguous to and partially overlapping the birdcage coil in an overlap region, the guard ring disposed adjacent;
- a first coaxial cable extending from the second coil assembly, along the birdcage coil, to a region on an opposite side of the birdcage coil from the second coil assembly, a sheath of the first coaxial cable being electrically connected with the guard ring;
- a first coil-to-coil decoupling circuit connected with the first coaxial cable for inhibiting the birdcage coil and the second volume coil assembly from coupling along the first coaxial cable.

12. The radio frequency coil as set forth in claim 11, wherein the second coil assembly includes an anterior coil connected with the first coaxial cable and a posterior coil connected with a second coaxial cable, the second coaxial cable extending from the posterior coil along the birdcage coil to the opposite side thereof, a sheath of the second coaxial cable being electrically connected to the guard ring, and further including:

- a second coil-to-coil decoupling circuit connected with the second coaxial cable for inhibiting the posterior coil and the birdcage coil from coupling through the second coaxial cable.

13. The radio frequency coil as set forth in claim 12 wherein the second coil-to-coil decoupling circuit is disposed in a common plane with the overlap region.

14. The radio frequency coil as set forth in claim 13 wherein the second coil-to-coil decoupling circuit is surrounded by an electrically conductive shield that is electrically connected to the sheath of the second coaxial cable; and, the first coil-to-coil decoupling circuit is disposed on an opposite side of the guard ring from the birdcage coil and is surrounded by an electrically conductive shield that is electrically connected to the shield of the first coaxial cable.

15. The radio frequency coil as set forth in claim 12, further including:

- a lower housing portion which supports the posterior coil, a lower part of the birdcage coil, and a lower part of the guard ring;

an upper housing assembly which supports the anterior coil, an upper part of the birdcage coil, and an upper part of the guard ring, the first and second housing portions being selectively mechanically couplable to provide a unitary construction and decouplable to facilitate patient access;

electrical connectors for providing radio frequency communication between the upper and lower birdcage coil parts and between the upper and lower guard ring parts.

16. A radio frequency coil for receiving magnetic resonance signals, the radio frequency coil comprising:

a first coil assembly;

a second coil assembly disposed contiguous to and partially overlapping the first coil assembly in an overlap region;

a coaxial lead extending from the second coil assembly, along the first coil assembly, to a region on an opposite side of the first coil assembly from the second coil assembly;

a coil-to-coil decoupling circuit connected with the first coaxial cable for inhibiting the first and second coil assemblies from coupling along the coaxial cable, the first decoupling circuit including:

a housing having a spool-like cable guide therein, the housing having first and second coaxial cable receiving shoulders for receiving the coaxial cable and locking the coaxial cable against longitudinal movement, the coaxial cable being looped around the cable guide to form an inductance and being interconnected with at least one tuning capacitor;

an electrically conductive radio frequency shield which shields the housing.

17. In a method of magnetic resonance imaging in which a temporally constant uniform magnetic field is generated through a head and neck examination region, magnetic field gradients are applied across the examination region, radio frequency signals are transmitted into the examination region to induce and manipulate magnetic resonance of dipoles therein, radio frequency signals are received from the resonating dipoles with a radio frequency coil assembly that has a first coil assembly around the head region and a second coil assembly around the neck region, and the received radio frequency signals are processed into an image representation, the improvement comprising:

receiving magnetic resonance signals from resonating dipoles in at least one of the head and neck regions with corresponding first and second volume coil assemblies;

passing signals received by one of the first and second volume coil assemblies through a cable which extends along the other volume coil assembly for processing into the volumetric image representation;

passing signals received from the other volume coil assembly along a second cable for processing into the volumetric image representation;

preventing the first and second volume coil assemblies from coupling to each other along the first cable;

generating the volumetric image representation of at least one of the head and neck regions from the signals passed along the first and second cables.

18. In the magnetic resonance imaging method as set forth in claim 17, the improvement further comprising:

decoupling the first coil assembly and operating the second coil assembly alone to image only the neck region.

19. In the magnetic resonance imaging method as set forth in claim 17, the improvement further comprising:

decoupling the second coil assembly and operating the first coil assembly alone to image only the head region.

20. In the magnetic resonance imaging method as set forth in claim 17, the improvement further comprising:

operating the first and second assemblies simultaneously to image the neck and head region simultaneously.

21. In the magnetic resonance imaging method as set forth in claim 17, the improvement further comprising:

tuning the first coil assembly and the second coil assembly while the first and second volume coils are separated;

overlapping the first and second coil assemblies and fixing the first and second coil assemblies together in an overlapped state;

retuning the first and second coil assemblies once; and, positioning a patient's head and neck in the first and second coil assemblies in preparation for inducing magnetic resonance.

22. In a method of magnetic resonance imaging in which a temporally constant uniform magnetic field is generated through a head and neck examination region, magnetic field gradients are applied across the examination region, radio frequency signals are transmitted into the examination region to induce and manipulate magnetic resonance of dipoles therein, radio frequency signals are received from the resonating dipoles with a radio frequency coil assembly that has a first coil assembly around the head region and a second coil assembly around the neck region, at least one coaxial lead extends from the second coil assembly along the first coil assembly and has a radio frequency decoupling circuit of adjustable frequency therein, and the received radio frequency signals are processed into an image representation, the method comprising:

adjusting the frequency of the decoupling circuit to match a received magnetic resonance frequency to prevent the first and second coil assemblies from coupling; and receiving magnetic resonance signals from resonating dipoles in at least one of the head and neck regions with corresponding first and second coil assemblies to generate a volumetric image representation of at least one of the head and neck regions.

23. A magnetic resonance method comprising:

tuning a birdcage coil which is mounted on a dielectric former to a magnetic resonance frequency;

tuning neck coils that are mounted on dielectric formers to the magnetic resonance frequency;

overlapping the birdcage and neck coils and adjusting the overlap until a preselected degree of mutual coupling is achieved;

fixing the dielectric formers of the birdcage and neck coils in the overlapped position;

retuning the birdcage coil and the neck coils, as necessary, in a single iteration; and, mounting outer housings around the neck and birdcage coils.

24. The magnetic resonance method as set forth in claim 23 further including:

positioning a head and neck of a patient in the birdcage and neck coils;

exciting resonance of selected dipoles within the patient's head and neck such that the dipoles generate magnetic resonance signals;

receiving the magnetic resonance signals with at least one of the birdcage and neck coils.

* * * * *